United States Patent
McDonald et al.

(10) Patent No.: US 7,109,055 B2
(45) Date of Patent: Sep. 19, 2006

(54) METHODS AND APPARATUS HAVING WAFER LEVEL CHIP SCALE PACKAGE FOR SENSING ELEMENTS

(75) Inventors: William G. McDonald, Scottsdale, AZ (US); Stephen R. Hooper, Mesa, AZ (US); Arvind S. Salian, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/039,688

(22) Filed: Jan. 20, 2005

(65) Prior Publication Data

US 2006/0160264 A1 Jul. 20, 2006

(51) Int. Cl.
*H01L 21/00* (2006.01)

(52) U.S. Cl. .......................... 438/51; 438/26; 438/127; 257/417; 257/788; 257/792

(58) Field of Classification Search ................ 438/51, 438/26, 127; 257/417, 788, 792
See application file for complete search history.

(56) References Cited

U.S. PATENT DOCUMENTS

| | | | |
|---|---|---|---|
| 5,605,489 A * | 2/1997 | Gale et al. .................... 451/28 |
| 6,316,840 B1 * | 11/2001 | Otani ......................... 257/787 |
| 6,335,224 B1 * | 1/2002 | Peterson et al. ............ 438/114 |
| 6,432,737 B1 * | 8/2002 | Webster ....................... 438/53 |
| 6,472,243 B1 * | 10/2002 | Gogoi et al. .................. 438/50 |
| 6,635,509 B1 * | 10/2003 | Ouellet ....................... 438/106 |
| 6,939,734 B1 * | 9/2005 | Franosch et al. ............. 438/53 |
| 6,951,769 B1 * | 10/2005 | Malone ....................... 438/51 |
| 2004/0023470 A1 * | 2/2004 | Hsu et al. .................... 438/460 |
| 2004/0118214 A1 | 6/2004 | McDonald et al. |
| 2005/0048688 A1 * | 3/2005 | Patel et al. .................... 438/53 |
| 2005/0130337 A1 * | 6/2005 | Wu et al. ..................... 438/48 |

* cited by examiner

*Primary Examiner*—Bradley K. Smith
*Assistant Examiner*—Steven J. Fulk
(74) *Attorney, Agent, or Firm*—Ingrassia,Fisher&Lorenz

(57) ABSTRACT

Methods are provided for manufacturing a sensor. The method comprises depositing a sacrificial material at a first predetermined thickness onto a wafer having at least one sense element mounted thereon, the sacrificial material deposited at least partially onto the at least one sense element, forming an encapsulating layer at a second predetermined thickness less than the first predetermined thickness over the wafer and around the deposited sacrificial material, and removing the sacrificial material. Apparatus for a sensor manufactured by the aforementioned method are also provided.

20 Claims, 3 Drawing Sheets

METHODS AND APPARATUS HAVING WAFER LEVEL CHIP SCALE PACKAGE FOR SENSING ELEMENTS

FIELD OF THE INVENTION

The present invention generally relates to chip packaging, and more particularly relates to wafer level chip scale packaging.

BACKGROUND OF THE INVENTION

Sensors are used in myriad applications and may be employed to collect any one of numerous types of data. Some sensors are used in determining pressure differentials, for example, between a reference pressure and a measured pressure or between two measured pressures. Typically, these pressure sensors include an integrated chip having circuitry printed thereon and/or sensing or other components mounted thereto. In some sensor configurations, the chip is disposed within a hard case that is configured to protect the sensing components and dissipate heat produced by the circuitry during a chip operation. In other sensor configurations, the chip also includes a plurality of bond wires that are used to couple the die to a circuit board. The bond wires typically extend from the chip and out of the case.

Although the aforementioned sensor configurations generally operate well in most applications, they may suffer from certain drawbacks in other applications. For instance, in a medical device context, components used in implantable medical devices are preferably extremely small in order to reduce discomfort that may be experienced by an implant patient. However, conventional sensors having cases, such as those described above, may have a relatively high elevation and/or large footprint geometry, thereby needlessly occupying space that could be eliminated from the implantable medical device. In another example, the aforementioned chips may be relatively expensive to manufacture. As a result, relatively inexpensive components may not incorporate sensor chip technology, or alternatively, if the chip is incorporated, the cost of the component is increased.

Accordingly, it is desirable to have an integrated chip package that is relatively small compared to conventional integrated chip packages. In addition, it is desirable to have a method for making the integrated component that is relatively simple to manufacture and inexpensive. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
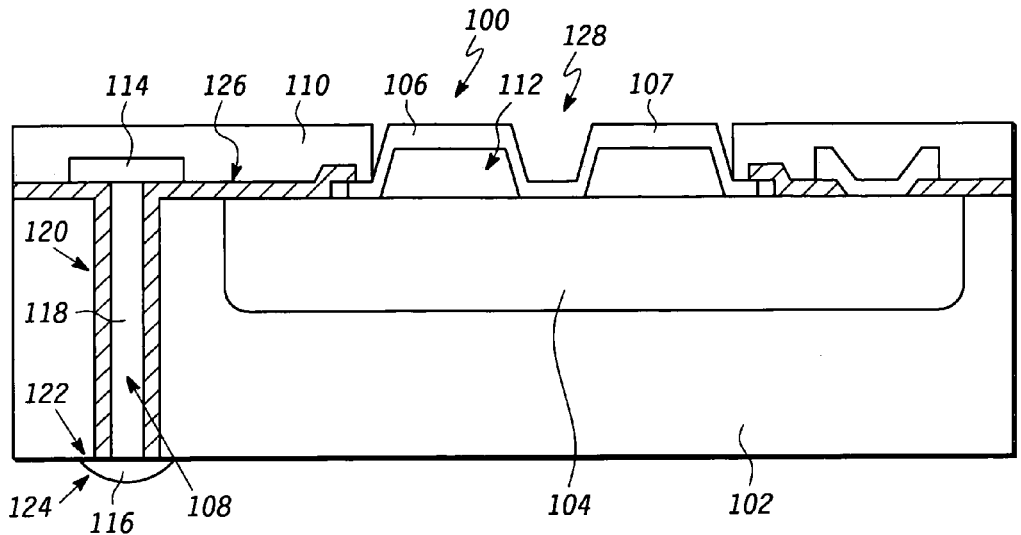
FIG. 1 is a cross section of an exemplary sensor.
Figure 2:
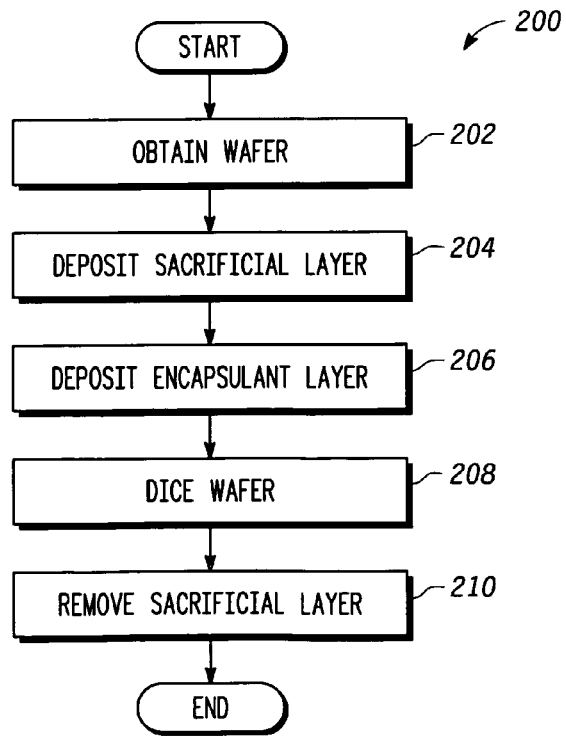
FIG. 2 is a flowchart illustrating an exemplary method of manufacturing the sensor illustrated in FIG. 1.

Turning now to FIG. 1, a cross-sectional view of an exemplary integrated component or sensor 100 is illustrated. Sensor 100 includes a substrate layer 102, circuitry 104, a sense element 106, an interconnect 108, and an encapsulant layer 110. Substrate layer 102 provides a base to which sensor components are coupled. It will be appreciated that substrate layer 102 may be any one of numerous types of materials conventionally used for a substrate, including for example, silicon, silicon germanium, gallium arsenide, silicon-on-insulator, insulating glass, sapphire, or any other type of suitable material. Circuitry 104 is disposed on at least a portion of substrate layer 102 and may be configured for various integrated circuit applications, such as for example, communications, transportation, general computation, and the like. For example, in the exemplary embodiment, circuitry 104 is configured to communicate pressure data. Circuitry 104 may be formed on substrate layer 102 in any one of numerous conventional manners, for example, screen printing, and photolithography.

Sense element 106 is configured to sense an ambient characteristic of the surroundings of sensor 100. Sense element 106 may be any one of numerous types of devices that may be used for sensing particular characteristics of ambient. For example, in the embodiment illustrated in FIG. 1, sense element 106 is a thin dome-shaped diaphragm defining a cavity 112 thereunder that expands or contracts in response to a pressure differential between a pressure within cavity 112 and ambient pressure. In order to process the sensed characteristic, sense element 106 is coupled to circuitry 104. Sense element 106 may be directly or indirectly coupled to circuitry 104 in any one of numerous conventional manners. Sense element 106 may also be coupled to a reference element 107 that provides reference data. Reference element 107 may be any one of numerous devices suitable for providing reference data. In the embodiment depicted in FIG. 1, reference element 107 is a dome-shaped diaphragm that is configured to provide a reference pressure. Additionally, reference element 107 is shown disposed next to sense element 106; however, it will be appreciated that reference element 107 may be coupled to any other portion of sensor 100. In the embodiment in FIG. 1, circuitry 104 is configured to calculate a differential between the reference pressure and the sensed ambient pressure.

Interconnect 108 allows circuitry 104 to communicate data sensed by sense element 106 and/or a differential calculated between sense element 106 and reference element 106 to other non-illustrated external components. In this regard, interconnect 108 is constructed of any one of numerous materials suitable for transmitting and receiving data, for example, metal or polysilicon. Interconnect 108 is at least partially disposed within a via 120 formed through substrate layer 102. However, interconnect 108 may be positioned in any section of sensor 100. Although a single interconnect 108 and via 120 are illustrated, it will be appreciated that more than one of each may be incorporated in sensor 100.

Interconnect 108 has a first end 114 and a second end 116. First end 114 is coupled to circuitry 104 and may be formed at one end of interconnect 108 or, as illustrated in FIG. 1, may be a separately formed piece that is subsequently coupled to interconnect 108. In either case, first end 114 is constructed of conductive material capable of electrical communication. Second end 116 extends external to sensor 100 and provides an interface between sensor 100 and any external components to which sensor 100 may be coupled, such as, for instance, a circuit board, module housing, or substrate. Similar to first end 114, second end 116 may be formed as part of interconnect 108, or alternatively, and as shown in FIG. 1, may be a separately formed piece. In the depicted embodiment in FIG. 1, second end 116 is a piece of conductive material having a flat section 122 coupled to interconnect 108 and a conductive section 124 coupled to the flat section 122. Conductive section 124 is bumped outward from sensor 100. To prevent crossing electrical connections that may potentially occur between interconnect 108 and circuitry 104, a passivation layer 126 overlies substrate layer 102 and via 120. Passivation layer 126 may be constructed of any one of a number of insulating materials, such as, for example, parylene, silicon dioxide, silicon nitride, and the like.

Encapsulant layer 110 is employed to protect circuitry 104 from chemical, physical, thermal and/or any other type of damage. In this regard, encapsulant layer 110 is constructed of any one of numerous types of encapsulating material capable of withstanding any chemical, physical, or thermal environment within which sensor 100 may be placed. Suitable materials include, but are not limited to, plastic, rigid polymers, polyimide, and the like. To allow sense element 106 to contact ambient, an opening 128 is provided therein. Opening 128 is disposed over sense element 106 such that sense element 106 is substantially exposed. Alternatively, sense element 106 is disposed within opening 128, as shown in FIG. 1. Additionally, opening 128 may be disposed over reference element 107, or reference element 107 may be disposed within opening 128. In one exemplary embodiment, opening 128 is sized such that encapsulant layer 1110 does not contact sense element 106.

With reference now to FIGS. 2–6, an exemplary method by which integrated component 100 may be manufactured will now be discussed. The overall process 200 will first be described generally. It should be understood that the parenthetical references in the following description correspond to the reference numerals associated with the flowchart blocks shown in FIG. 2. First, a wafer 300 having substrate layer 302, circuitry 304, at least one sense element 306 and at least one interconnect 308 is obtained (202). Then, a sacrificial layer 330 is deposited over each of the sense elements 306 (204). Next, an encapsulant layer 332 is applied to the wafer 300 (206). The wafer 300 may then be diced (208). Lastly, the sacrificial layer 330 is removed (210). These steps will now be described in further detail below.

Figure 3:
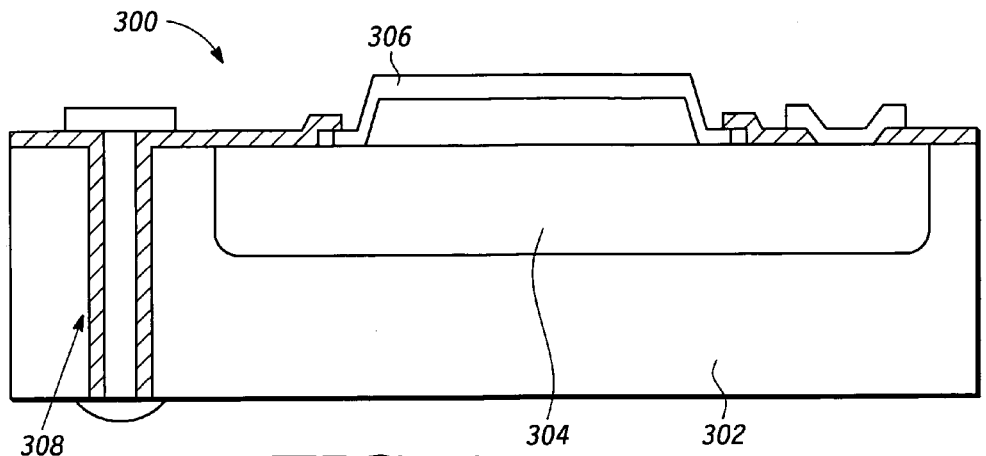
FIG. 3 is an illustration of a step of the method illustrated in FIG. 2.

Turning to FIG. 3, a section of an exemplary wafer 300 that may be obtained (202) is illustrated. The wafer section 300 includes a substrate layer 302, circuitry 304 that is printed or screened thereon, at least one sense element 306 coupled to the circuitry 304, and an interconnect 308 that extends through the wafer section 300. The wafer section 300 is part of a wafer that includes more than one wafer sections 300. The wafer may be manufactured as part of process 200 in any one of numerous conventional manners for fabricating a wafer, such as, for example, using front-end manufacturing techniques, including, but not limited to photolithography, chemical vapor deposition ("CVD"), physical CVD, chemical mechanical planarization, and/or chemical etching, and back-end manufacturing techniques. Alternatively, the wafer 300 may be obtained prior to process 200.

Figure 4:
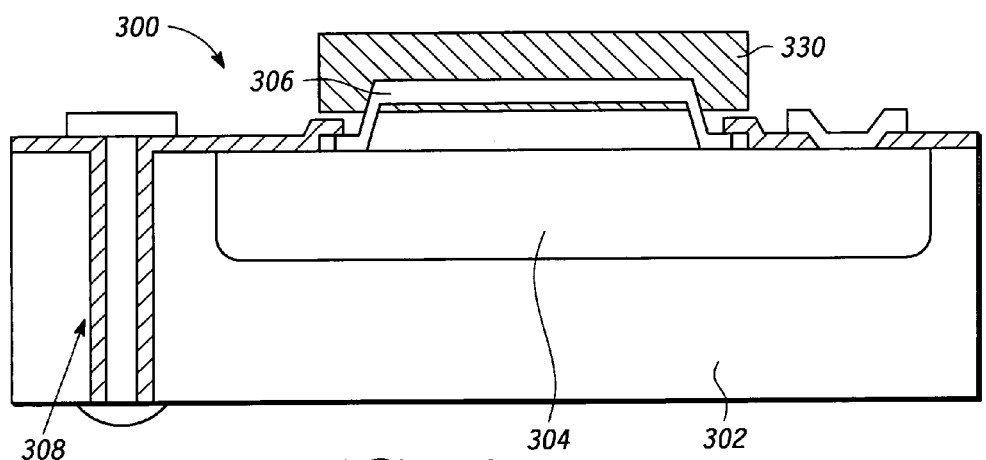
FIG. 4 is an illustration of another step of the method illustrated in FIG. 2.
Figure 5:
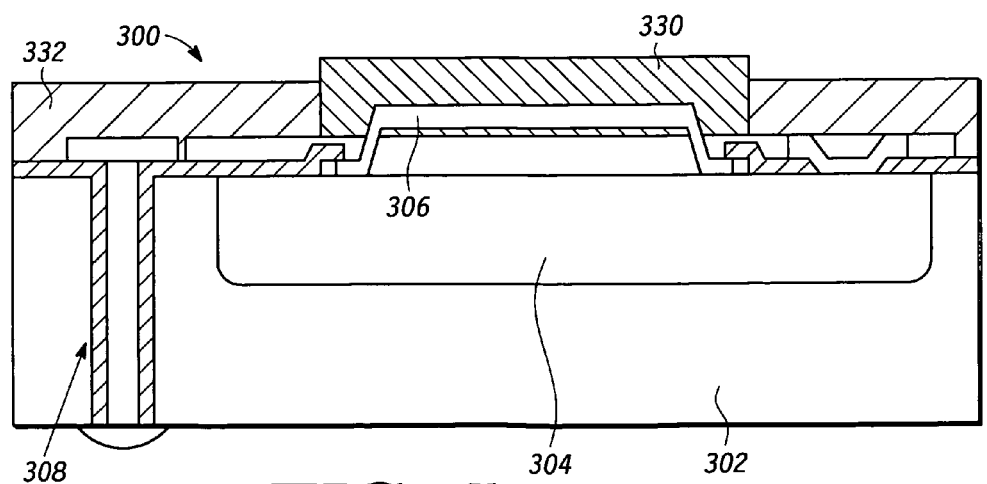
FIG. 5 is an illustration of yet another step of the method illustrated in FIG. 2.

As briefly mentioned above, next, a sacrificial layer 330, shown in FIG. 4, is deposited over each sense element 306 (204). Deposition may be performed in any one of numerous manners. For example, in one embodiment, the sacrificial layer material is dispensed over each sense element 306 using an appropriately configured needle. In another exemplary embodiment, a suitably configured mask is placed over the wafer 300 and sacrificial layer material is screened onto the mask and wafer 300. In still another exemplary embodiment, the sacrificial layer material may deposited using a shadow mask and spray, or spin on application The sacrificial layer 330 is preferably deposited such that at least the sense element 106 is completely covered. In one exemplary embodiment, the sacrificial layer 330 is deposited at a thickness of between about 0.020 and 2 mm. Alternatively, the sacrificial layer 330 may be at thickness of about 10% of the thickness of the resultant sensor 100. However, it will be appreciated that any other suitable thickness may be employed as well.

The sacrificial layer material may be any one of a number of materials suitable for temporarily adhering to sense element 306 without damage. Preferably, the material is thixotropic, able to withstand curing temperatures of at least about 140° C. or any other temperature that may be employed in process 200, and able to endure the subsequent dicing step without decomposing (208). Additionally, the material is preferably easily removable upon the application of a removal solution or removal process. In one exemplary embodiment, the sacrificial material is water soluble and removable with the application of deionized water. In another exemplary embodiment, the material is removable by using photoresist stripper, or another chemical or plasma material. Suitable sacrificial layer materials include, but are not limited to adhesives Dymax 9-20553 provided by Dymax Corporation of Torrington, Conn. or Aquabond S65 provided by Aquabond, LLC of Placentia, Calif. For some materials, curing may need to occur in order to sufficiently set sacrificial layer 330 over sense element 306. It will be appreciated that although sacrificial layer 330 is described herein as being deposited over sense element 306, deposition may also occur on any other wafer-mounted component that does not need to be protected.

After the sacrificial layer material is deposited, an encapsulant layer 332 is formed over the wafer 300 (206). The encapsulant layer 332, illustrated in FIG. 5, may be formed using any one of numerous conventional methods for encapsulating a wafer, including, but not limited to liquid molding technology. For example, any wafer level molding technology may be used. In one exemplary embodiment, a pellet made of encapsulant layer material is placed on the wafer 300 while the wafer 300 is mounted between two hot platens. As the hot platens come together, heat from the platens melts the pellet causing the encapsulant layer material to flow over the wafer 300. Preferably, an amount of encapsulant layer material is used such that the material flows in the spaces between the sacrificial layer 330, but does not envelop the sacrificial layer 330. The material used to make the encapsulant layer 332 may be any one of a number of materials typically used as a protective coating over circuitry. For instance, the encapsulant layer 332 may be any type of plastic, epoxy, polyimide, or any other type of suitable insulating material.

Figure 6:
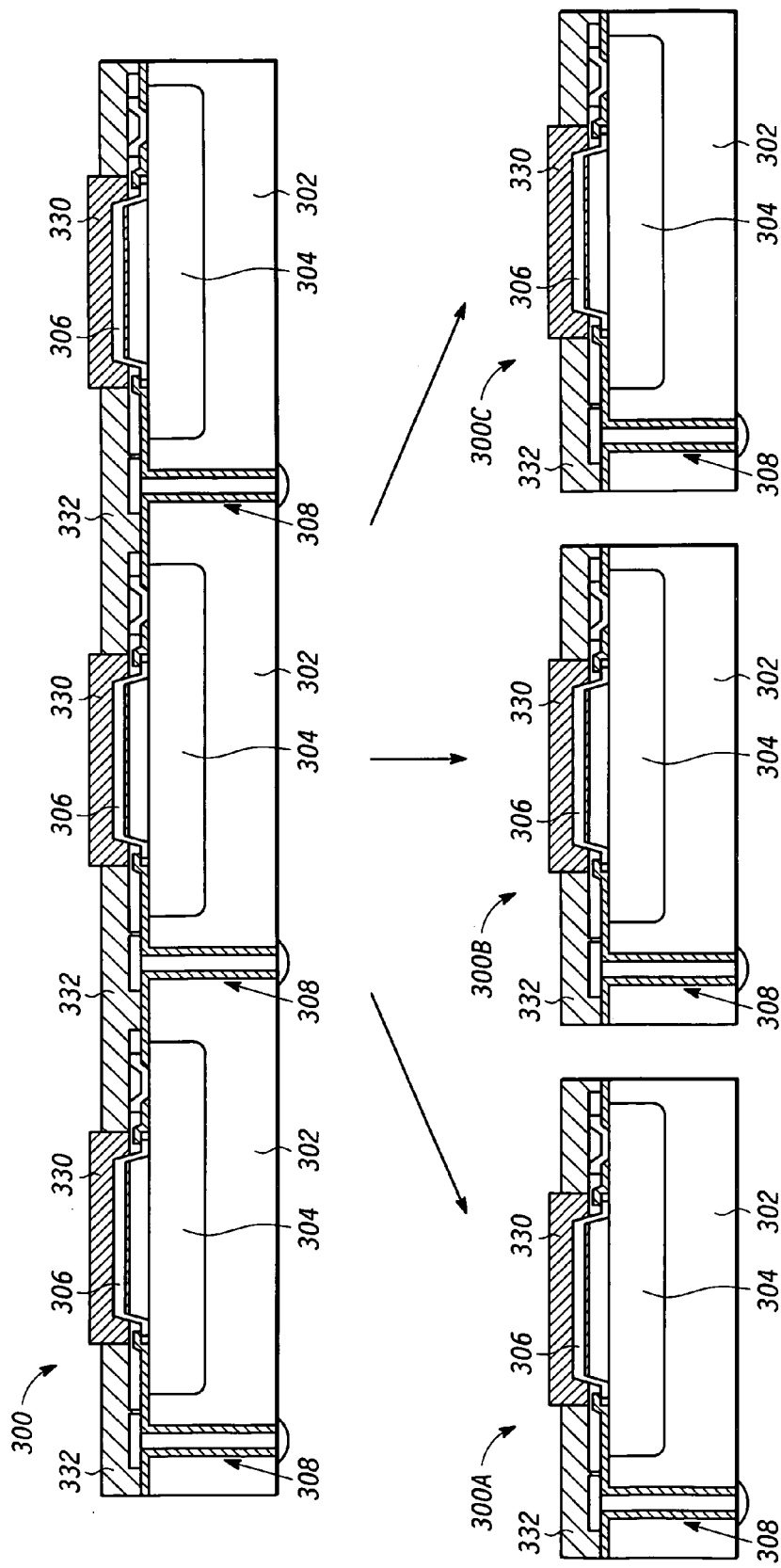
FIG. 6 is an illustration of still another step of the method illustrated in FIG. 2.

After the encapsulant layer 332 is appropriately formed over the wafer 300, the wafer 300 may be diced (208). During the dicing step (208), the wafer 300 is cut into a plurality of die or chips 300a, 300b, 300c, as illustrated in FIG. 6. Dicing may be performed using any conventional method of dicing, such as employing any saw technology. Although the dicing step (208) is described here as taking place after the encapsulating step (206), it will be appreciated that dicing may occur at any other suitable junction during process (200), for example, at the end of process (200).

Next, sacrificial layer 330 is removed from chip 300a (210). Sacrificial layer 330 may be removed using any appropriate removal solution, such as deionized water, plasma, or other chemical, depending on the sacrificial layer material employed. In one example, the removal solution is placed under high pressure and subsequently sprayed at the sacrificial layer 330. When sacrificial layer 300 material is removed, an opening 338 is formed exposing sense element 308, resulting in sensor 100, illustrated in FIG. 1. The chip 300a can then be mounted to a circuit board or any other external device.

Thus, there has now been provided an integrated chip scale package that is relatively small in comparison to conventional integrated chip packages. Additionally, a method has been provided for processing the chip scale packaging that is relatively inexpensive and simple.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for manufacturing a sensor comprising:
    depositing a sacrificial material at a first predetermined thickness onto a wafer having at least one sence element mounted thereon, the sacrificial material deposited at least partially onto the at least one sense element;
    forming an encapsulating layer at a second predetermined thickness less than the first predetermined thickness over the wafer and around the deposited sacrificial material; and
    removing the sacrificial material.

2. The method of claim 1, further comprising the step of dicing the wafer to form a plurality of chips, before the step of removing.

3. The method of claim 1, further comprising the step of curing the wafer and the deposited sacrificial material, after the step of depositing.

4. The method of claim 1, wherein the step of depositing further comprises depositing a material having thixotropic properties and having a capability to withstand a temperature of at least about 140° C.

5. The method of claim 4, wherein the step of depositing the material further comprises depositing a temporary, water-soluble thermoplastic adhesive material.

6. The method of claim 1, wherein the step of depositing comprises dispensing the sacrificial material from a needle onto the wafer.

7. The method of claim 1, wherein the step of depositing comprises:
    placing a mask on the wafer, the mask exposing the at least one sense element;
    silk screening sacrificial material over the mask.

8. The method of claim 1, wherein the step of forming an encapsulating layer comprises using liquid molding technology to form the encapsulating layer.

9. The method of claim 1, wherein the step of removing comprises applying a solvent to the sacrificial material.

10. The method of claim 9, wherein the step of removing comprises spraying high pressure deionized water onto the sacrificial material.

11. The method of claim 9, wherein the step of removing comprises applying a photoresist stripper to the sacrificial material.

12. The method of claim 9, wherein the step of removing comprises applying plasma to the sacrificial material.

13. The method of claim 1, further comprising coupling the wafer to a circuit board, after the step of removing the sacrificial material.

14. A method for manufacturing a sensor comprising:
    depositing a sacrificial material at a first predetermined thickness onto a wafer having at least one sense element mounted thereon, the sacrificial material having thixotropic properties and having a capability to withstand a temperature of at least about 140° C. and being deposited at least partially onto the at least one sense element;
    forming an encapsulating layer at a second predetermined thickness less than the first predetermined thickness over the wafer and around the deposited sacrificial material; and
    removing the sacrificial material.

15. The method of claim 14, wherein the step of depositing comprises dispensing the sacrificial material from a needle onto the wafer.

16. The method of claim 14, wherein the step of depositing comprises:
    placing a ask on the wafer, the mask exposing the at least one sense element;
    silk screening the sacrificial material over the mask.

17. The method of claim 14, wherein the step of forming an encapsulating layer comprises using liquid molding technology to form the encapsulating layer.

18. The method of claim 14, wherein the step of removing comprises applying a solvent to the sacrificial material.

19. A sensor comprising:
    a wafer having a first and a second side, each of the wafer and second sides having a surface;

an interconnect extending between the wafer first and second sides and including a first end and a second end, the interconnect first end exposed at the surface of the wafer first side and the interconnect second end exposed at and extending alone a portion of the surface of the wafer second side;

a sense element coupled to and disposed over the wafer second side the sense element including a first portion and a second portion, the first portion in contact with the interconnect second end;

circuitry formed in the wafer second side contacting the interconnect and the sense element; and an encapsulant layer coupled to the wafer second side, the encapsulant layer having an opening formed therethrough exposing the sense element second portion.

20. The sensor of claim 19, wherein the encapsulant layer comprises plastic, polyimide, or an insulator.

* * * * *

UNITED STATES PATENT AND TRADEMARK OFFICE
CERTIFICATE OF CORRECTION

| | | |
|---|---|---|
| PATENT NO. | : 7,109,055 B2 | Page 1 of 1 |
| APPLICATION NO. | : 11/039688 | |
| DATED | : September 19, 2006 | |
| INVENTOR(S) | : McDonald et al. | |

It is certified that error appears in the above-identified patent and that said Letters Patent is hereby corrected as shown below:

Column 6, line 55, "ask" should be changed to --mask--.

Signed and Sealed this

Third Day of July, 2007

JON W. DUDAS
*Director of the United States Patent and Trademark Office*

UNITED STATES PATENT AND TRADEMARK OFFICE
CERTIFICATE OF CORRECTION

PATENT NO. : 7,109,055 B2  Page 1 of 1
APPLICATION NO. : 11/039688
DATED : September 19, 2006
INVENTOR(S) : William G. McDonald It is certified that error appears in the above-identified patent and that said Letters Patent is hereby corrected as shown below:

In Column 5, Line 52, Claim No. 1:
Change "a wafer having at least one sence" to --a wafer having at least one sense--

In Column 6, Line 15, Claim No. 7:
Change "silk screening sacrificial material" to --silk screening the sacrificial material--

In Column 6, Line 41, Claim No. 14:
Change "of at least about 140° C. and being" to --of at least about 140° C and being--

In Column 6, line 52, "ask" should be changed to --mask--.

In Column 6, Line(s) 66-67, Claim No. 19:
Change "each of the wafer and second sides" to --each of the wafer first and second sides--

In Column 7, Line 5, Claim No. 19:
Change "exposed at and extending alone a portion" to --exposed at and extending along a portion--

In Column 7, Line 8, Claim No. 19:
Change "second side the sense element including" to --second side, the sense element including--

Signed and Sealed this

Twenty-fourth Day of June, 2008

JON W. DUDAS
*Director of the United States Patent and Trademark Office*